United States Patent [19]

McCann

[11] Patent Number: 5,629,097
[45] Date of Patent: May 13, 1997

[54] APPARATUS FOR FABRICATING SEMICONDUCTOR LASERS

[75] Inventor: Patrick J. McCann, Norman, Okla.

[73] Assignee: The Board of Regents of the University of Oklahoma, Norman, Okla.

[21] Appl. No.: 346,702

[22] Filed: Nov. 30, 1994

Related U.S. Application Data

[62] Division of Ser. No. 234,775, Apr. 28, 1994, Pat. No. 5,454,002.

[51] Int. Cl.⁶ .............................. B28D 5/00; B26F 3/00; H01L 21/78; H01L 21/304
[52] U.S. Cl. .................... 428/594; 428/620; 428/636; 225/93
[58] Field of Search .................... 428/594, 596, 428/598, 620, 636, 634; 225/93

[56] References Cited

U.S. PATENT DOCUMENTS

| | | | |
|---|---|---|---|
| 1,394,121 | 10/1921 | Sclater | 336/210 |
| 1,897,040 | 2/1933 | Christopher | 336/210 |
| 4,170,033 | 10/1979 | Ridgway et al. | 360/121 |
| 4,237,601 | 12/1980 | Woolhouse et al. | 437/226 |
| 4,498,451 | 2/1985 | Beltz et al. | 225/103 |
| 4,620,307 | 10/1986 | Kappeler | 372/50 |
| 4,865,241 | 9/1989 | Hamel | 225/96.5 |

(List continued on next page.)

FOREIGN PATENT DOCUMENTS

| | | |
|---|---|---|
| 0070689 | 6/1978 | Japan . |
| 0112677 | 6/1984 | Japan . |
| 2177583 | 7/1989 | Japan . |
| 3006875 | 1/1991 | Japan . |
| 36875 | 1/1991 | Japan . |

OTHER PUBLICATIONS

J.C. Dyment et al., "Continuous Operation of GaAs Junction Lasers on Diamond Heat Sinks at 200° K.," *Appl. Phys. Let.*, 11(9), 1 Nov. 1967, pp. 292–294.

H. Holloway and E.M. Logothesis, "Epitaxial Growth of Lead Tin Telluride", *J. Appl. Phys.*, 1970, 41, p. 3543.

R. Eng, J.F. Butler, K.J. Linden, "Tunable Diode Laser Spectroscopy: An Invited Review", *Optical Engineering*, Nov./Dec. 1980, vol. 19, No. 6, pp. 945–960.

(List continued on next page.)

*Primary Examiner*—John Zimmerman
*Attorney, Agent, or Firm*—Dunlap & Codding, P.C.

[57] ABSTRACT

A semiconductor laser device, and method for making such, having higher operating temperatures than previously available. A semiconductor epitaxial layer is bonding to a cleaving assembly which allows the epitaxial layer to be manipulated without use of traditional substrate forms. The resulting semiconductor laser is bonded to a metal portion which serves as a heat sink for dissipating heat from the active lasing region. The resulting semiconductor lasers can be cooled by thermoelectric cooling modules, thus eliminating the necessity of using more bulky cryogenic systems.

17 Claims, 6 Drawing Sheets

U.S. PATENT DOCUMENTS

| | | | |
|---|---|---|---|
| 4,943,971 | 7/1990 | Fiet et al. | 372/46 |
| 4,995,539 | 2/1991 | Richard | 225/96.5 |
| 4,997,792 | 3/1991 | McClurg | 437/226 |
| 5,028,563 | 7/1991 | Feit et al. | 437/129 |
| 5,154,333 | 10/1992 | Bauer et al. | 225/96.5 |
| 5,171,717 | 12/1992 | Broom et al. | 437/226 |
| 5,174,188 | 12/1992 | Petroz | 225/96 |
| 5,176,946 | 1/1993 | Wieloch | 336/210 |
| 5,260,960 | 11/1993 | Amann et al. | 372/46 |
| 5,272,114 | 12/1993 | Van Berkum et al. | 437/226 |
| 5,310,104 | 5/1994 | Zaidel et al. | 225/96.5 |
| 5,393,707 | 2/1995 | Canning | 437/129 |

OTHER PUBLICATIONS

Y. Horikoshi, M. Kawashima, and H. Saito, "PbSnSeTe–PbSeTe Lattice–Matched Double Heterostructure Lasers", *Japanese J. Appl. Phys.*, 1982, 21, p. 77.

J.A. Sell, "Tunable Diode Laser of Carbon Monoxide in Engine Exhaust", *SPIE*, 1983, 438, p. 67.

J.E. Butler, N. Bottka, R.S. Sillman, D.K. Gaskill, "In Situ Real–Time Diagnostics of OMVPE Using IR–Diode Laser Spectroscopy", *J. Crystal Growth*, 1986, 77, p. 163.

R. Rosman, A. Katzir, P. Norton, K.H. Bachem, and H. Preier, "On the Performance of Selenium Rich Lead–Salt Heterostructure Diode Lasers with Remote p–n Junction", *IEEE J. Quantum Electronics* QE–23, 94 (1987).

U. Lachish, S. Rotter, E. Adler, U. El–Hanany, "Tunable Diode Laser Based Spectroscopic System for Ammonia Detection in Human Respiration", *Rev. Sci. Instrum.*, 1987, 58, p. 923.

P.J. MCann, J. Fuchs, Z. Feit and C.G. Fonstad, "Phase Equilibria and Liquid Phase Epitaxy Growth of PbSnSeTe Lattice Matched to PbSe", *J. Appl. Phys.* 62, 2994 (1987).

A. Shahar and A. Zussman, "PbSnTe–PbTeSe Lattice Matched Single Heterostructure Diode Lasers Grown By LPE On A (110) Oriented PbSnTe Substrates", *Infrared Phys.*, vol. 27, No. 1, pp. 45–47, 1987.

H. Preier, Z. Feit, J. Fuchs, D. Kostyk, W. Jalenak, and J. Sproul, "Status of Lead Salt Laser Development at Spectra–Physics", presented at the Second International Symposium on Monitoring of Gaseous Pollutants by Tunable Diode Lasers, Nov. 1988.

V.M. Bermudez, R.L. Rubinovitz, and J.E. Butler, "Study of the Vibrational Modes of Subsurface Oxygen on Al(111) Using Diode Laser Infrared Reflection–Absorption Spectroscopy", *J. Vac. Sci. Technol. A*, vol. 6, No. 3, May/Jun. 1988, pp. 717–721.

B. Spanger, U. Schiessl, A. Lambrecht, H. Böttner, and M. Tacke, "Near–Room–Temperature Operation of $Pb_{1-x}Sr_xSe$ Infrared Diode Lasers Using Molecular Beam Epitaxy Techniques", *Appl. Phys. Lett.*, 1988, 53, p. 2582.

M. Loewenstein, "Diode Laser Harmonic Spectroscopy Applied to In Situ Measurements of Atmospheric Trace Molecules", *J. Quant. Spectros. Radiat. Transfer*, 1988, 40, pp. 249–256.

U.S. Ser. No. 07/367,459, entitled "A Chemical Method for the Modification of Substrate Surface to Accomplish Heteroepitaxial Crystal Growth", by P.J. McCann and C.G. Fonstad, filed Jun. 16, 1989.

E. Yablonovitch, E. Kapon, T.J. Gmitter, C.P. Yun and R. Bhat, "Double Heterostructure GaAs/AlGaAs Thin Film Diode Lasers on Glass Substrates", *IEEE Photonics Technology Letters*, vol. 1, No. 2, Feb. 1989, p. 41.

Z. Feit, D. Kostyk, R.J. Woods, and P. Mak, "Single–Mode Molecular Beam Epitaxy Grown PbEuSeTe/PbTe Buried Heterostructure Diode Lasers for $CO_2$ High–Resolution Spectroscopy", *Appl. Phys. Lett.*, 1991, 58, pp. 343–345.

R.M. Scheck and D.L. Wall, "Medical Diagnostics with TDLs", *Photonics Spectra*, Jan. 1991, pp. 110–112.

P.J. McCann, "The Role of Substrate Surface Reactions in Heteroepitaxy of PbSe on $BaF_2$", *Mat. Res. Soc. Symp. Proc.*, 221, 1991, pp. 289–293.

P.J. McCann and C.G. Fonstad, "Liquid Phase Epitaxial Growth of PbSe on (111) and (100) $BaF_2$", *Journal of Crystal Growth*, 114, 1991, pp. 687–692.

P.J. McCann and C.G. Fonstad, "Auger Electron spectroscopic Analysis of Barium Fluoride Surfaces Exposed to Selenium Vapor", *Journal of Electronic Materials*, vol. 20, No. 11, 1991, pp. 915–920.

C. Camperi–Ginestet, M. Hargis, N. Jokerst, and M. Allen, "Alignable Epitaxial Liftoff of GaAs Materials with Selective Deposition Using Polyimide Diaphragms", *IEEE Transactions Photonics Technology Letters*, vol. 3, No. 12, Dec. 1991, pp. 1123–1126.

W.K. Chan, D.M. Shah, T.J. Gmitter and C. Caneau, "Inverted Gate GaAs Mesfet By Epitaxial Liftoff", *Electronics Letters*, 9th Apr. 1992, vol. 28, No. 8, p. 708.

R. Zucca, M. Zandian, J.M. Arias, and R.V. Gil, "HgCdTe Double Heterostructure Diode Lasers Grown by Molecular Beam Epitaxy", *J. Vac. Sci. Technol.*, 1992, B 10, pp. 1587–1593.

D. E. Cooper and R.U. Martinelli, "Near–Infrared Diode Lasers Monitor Molecular Species", *Laser Focus World*, Nov. 1992, pp. 133–146.

J.J. Callahan, K.P. Martin, T.J. Drabik, B.B. Quimby and C. Fan, "Alignable Liftoff Transfer of Device Arrays Via A Single Polymeric Carrier Membrane", *Electronic Letters*, 27th May 1992, vol., 29, No. 11, pp. 951–953.

M. Wolverton and B. Ables, "The Use of Capillary Action Measurements for Solderability Improvement", *TI Technical Journal*, Jul.–Aug. 1993, pp. 18–28.

G. Lu and E. Borchelt, "CVD Diamond Boosts Performance of Laser Diodes", *Photonics Spectra*, Sep. 1993, pp. 88–91.

P.J. McCann, "The Effect of Composition Dependent Lattice Strain on the Chemical Potential of Tellurium in $Pb_{1-x}SN_xSe_{1-y}Te_y$ Quaternary Alloys", *Mat. Res. Soc. Symp. Proc.*, vol. 311, 1993, pp. 149–153.

P.J. McCann, "Growth of $PbSe_{0.78}Te_{0.22}$ Lattice–Matched with $BaF_2$", *Thin Solid Films*, 227, 1993, pp. 185–189.

F. Agahi, Kei May Lau, Arvind Baliga, David Loeber and Neal Anderson, "Photo–Pumped Strained–Barrier Quantum Well Lasers Fabricated by Epitaxial Liftoff", presented at 1993 International Semiconductor Device Research Symposium, pp. 415–418.

G.S. Matijasevic, C.C. Lee and C.Y. Wang, "Au–Sn Alloy Phase Diagram and Properties Related To Its Use as a Bonding Medium", *Thin Solid Films*, 223, 1993, pp. 276–287.

A. Ravid and A. Zussman, "Laser Action and Photoluminescence in an Indium–Doped n–type $Hg_{1-x}Cd_xTe(x=0.375)$ Layer Grown by Liquid Phase Epitaxy", *J. Appl. Phys.*, 1993, 73, pp. 3979–3987.

P.J. McCann and D. Zhong, "Liquid Phase Epitaxy Growth of $Pb_{1-x}Sn_xSe_{1-y}Te_y$ Alloys Lattice Matched with $BaF_2$", *J. Appl. Phys.*, 75 (2), 15 Jan. 1994, pp. 1–6.

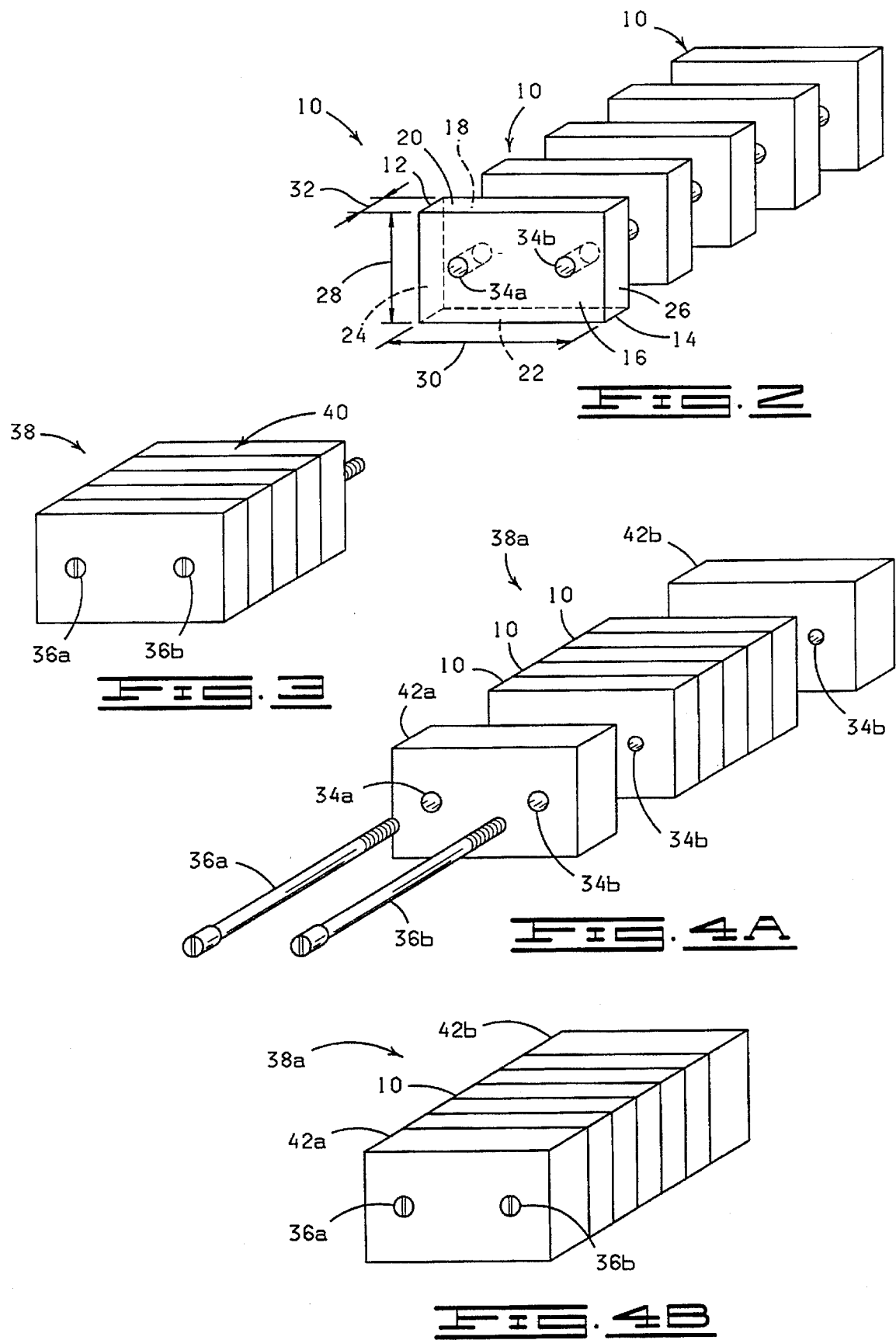

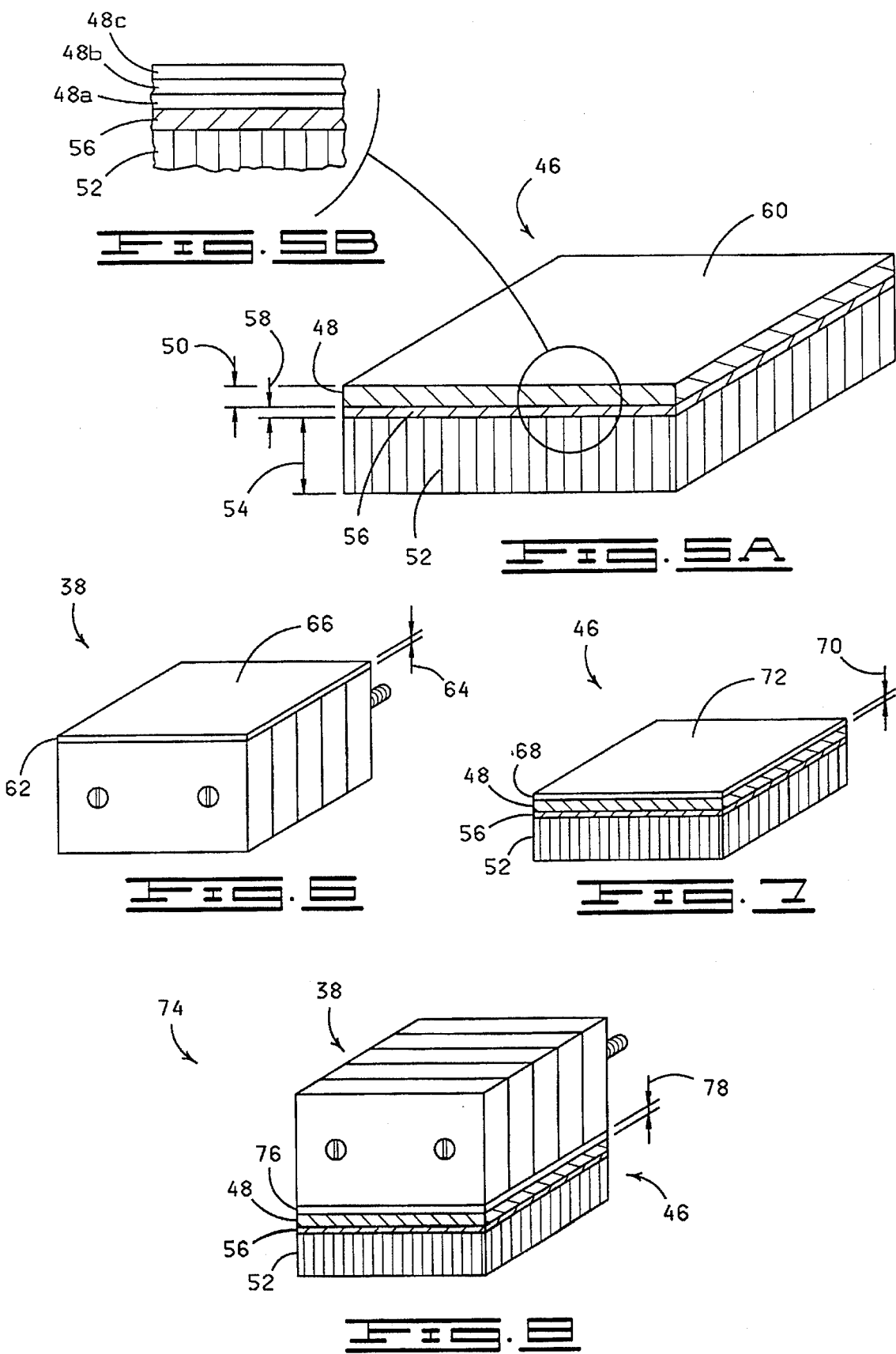

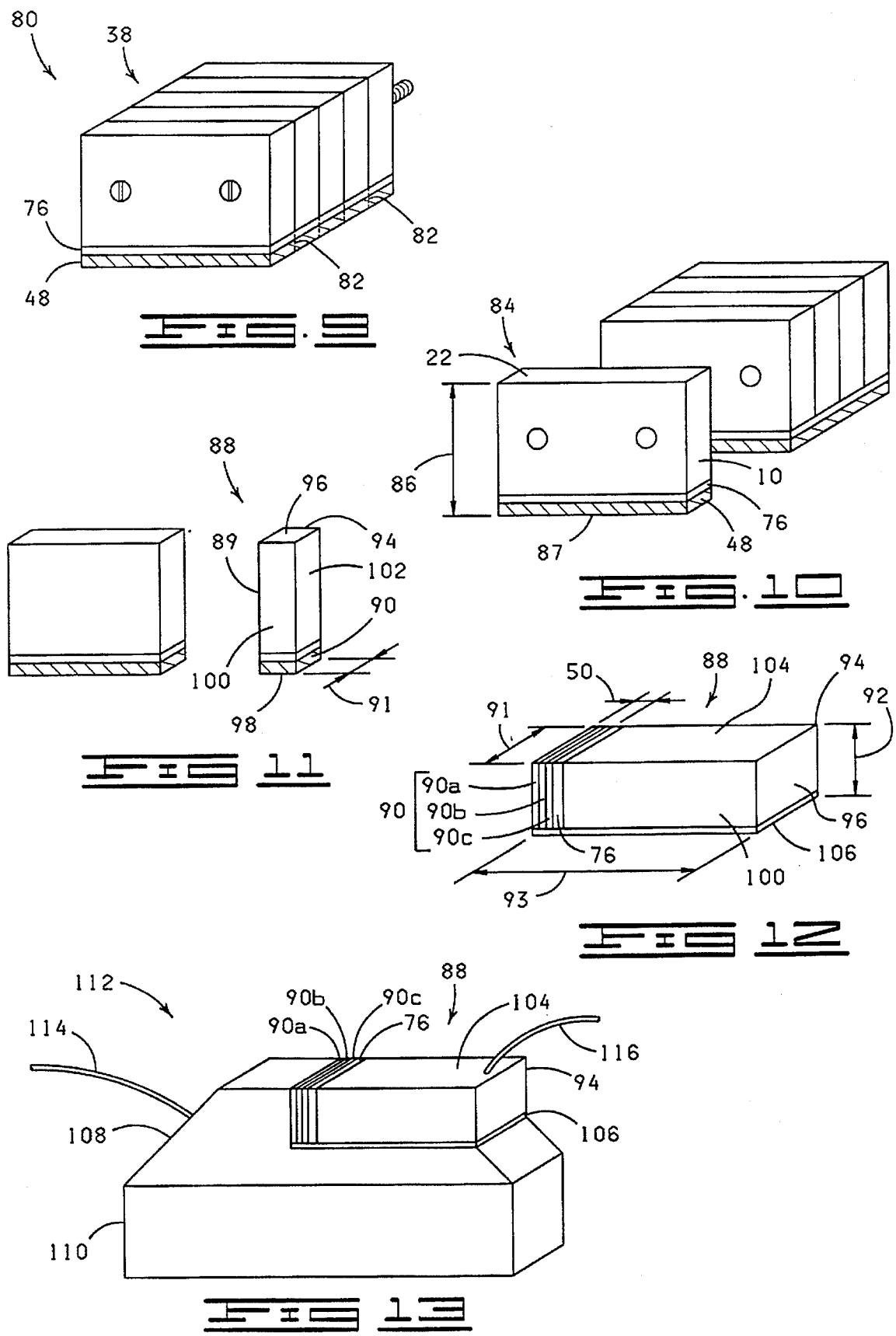

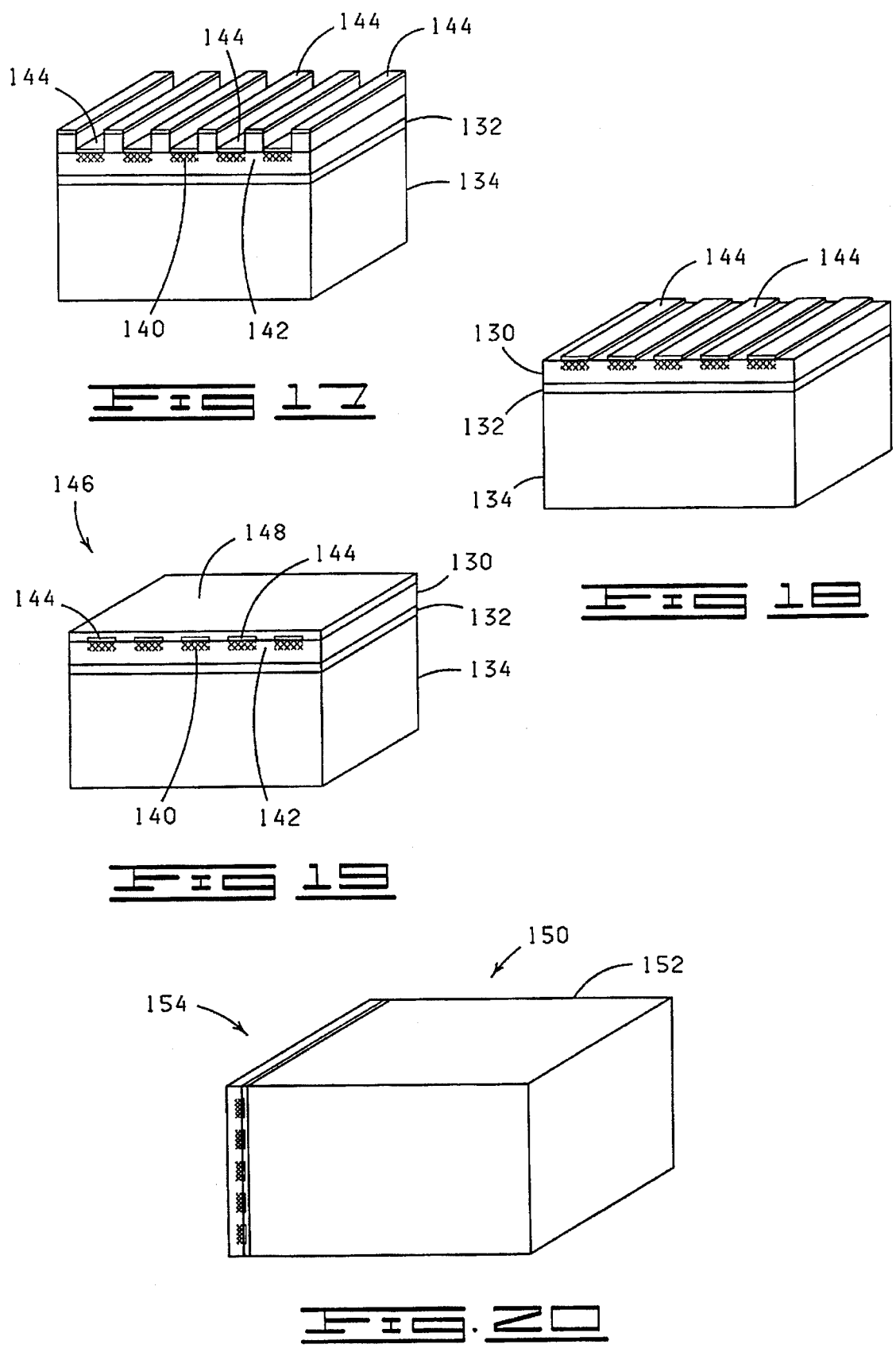

APPARATUS FOR FABRICATING SEMICONDUCTOR LASERS

This is a divisional of application Ser. No. 08/234,775 filed on Apr. 28, 1994 now U.S. Pat. No. 5,454,002.

BACKGROUND

The present invention is directed to a semiconductor laser, and a method for making such, having a high thermal conductivity heat sink component enabling the laser to be operated at higher temperatures.

Long-wavelength semiconductor lasers, which emit tunable infrared radiation in the 3 to 30 micron spectral range, are primarily used in tunable diode laser (TDL) spectroscopy systems. TDL spectroscopy, which involves tuning the laser around the absorption bands of a particular molecule, can readily measure sub parts per billion concentrations of trace gases making it a useful tool for detecting and monitoring gaseous pollutants. New pollution emission standards dictated by the Clean Air Act of 1990 will require the monitoring of thousands of smokestacks and other pollution sources throughout the United States. TDL spectroscopy, with its high resolution capabilities, is ideally suited for such monitoring. Atmospheric chemists are presently designing and building TDL spectrometers to measure trace gas concentrations throughout the Earth's atmosphere (M. Loewenstein, "Diode Laser Harmonic Spectroscopy Applied to In Situ Measurements of Atmospheric Trace Molecules", *J. Quant. Spectros. Radiat. Transfer*, 1988, 40, p. 249). Moreover, long-wavelength tunable diode lasers can be used in feedback control systems to actually reduce emission of pollutants (J. A. Sell, "Tunable Diode Laser of Carbon Monoxide in Engine Exhaust", *SPIE*, 1983, 438, p.67). Advances in laser performance may eventually allow extension of this pollution control technology to automobiles thus greatly expanding the market for long-wavelength lasers. TDL spectroscopy has also been used to study sub-monolayer concentrations of adsorbates on substrate surfaces (V. M. Bermudez, R. L. Rubinovitz and J. E. Butler, "Study of Vibrational Modes of Subsurface Oxygen on Al (111) Using Diode Laser Infrared Reflection-Absorption Spectroscopy", *J. Vac. Sci. Tech.*, 1988, A6, p. 717). Due to the non-invasive nature of the laser probe, this technique can provide useful information on catalytic reactions and chemical processes (J. E. Butler, N. Bottka, R. S. Sillman, D. K. Gaskill, "In Situ, Real-Time Diagnostics of OMVPE Using IR-Diode Laser Spectroscopy", *J. Crystal Growth*, 1986, 77, p. 163).

An important TDL spectroscopy feature is its ability to identify and differentiate among compounds that contain different isotopes of a particular element. TDL spectrometers can therefore be used to monitor the motion of isotope-tagged tracer molecules. For example, pollutants tagged with $^{13}C$ could be released in the atmosphere and their motion monitored with airborne TDL spectrometers. This offers the unique advantage of observing chemical reaction pathways.

Another example of isotope tracing is in medical diagnostics. Metabolic pathways can be monitored by measuring the $^{13}CO_2/^{12}CO_2$ ratio in the exhaled breath of a patient who has been administered a substance tagged with the non-radioactive isotope $^{13}C$. The $^{13}CO_2$ production correlates directly with the rate at which the particular substance is metabolized. For example, a simple diabetes test would involve feeding a patient $^{13}C$-labeled sugar and monitoring the $^{13}CO_2$ production rate. Such non-invasive analysis of metabolic pathways can form the basis for a whole new field of health research and patient diagnosis. (U. Lachish, S. Rotter, E. Adler, U. El-Hanany, "Tunable Diode Laser Based Spectroscopic System for Ammonia Detection in Human Respiration", *Rev. Sci. Instrum.*, 1987, 58, p. 923, and R. M. Scheck and D. L. Wall, "Medical Diagnostics with TDLs", *Photonics Spectra*, January 1991, p. 110).

Although some near-infrared spectrometers based upon III-V semiconductor lasers have been developed (D. E. Cooper and R. U. Martinelli, "Near-Infrared Diode Lasers Monitor Molecular Species", *Laser Focus World*, November 1992, 133), the most widely used TDL spectrometers are based upon narrow bandgap IV-VI semiconductor (also known as lead salt) lasers. Temperature tuned IV-VI semiconductor lasers operate in the 3 to 30 µm spectral region, where gas molecules have their strongest absorption lines, and continue to exhibit better performance characteristics than lasers made from other narrow bandgap semiconductors such as HgCdTe (R. Zucca, M. Zandian, J. M. Arias, and R. V. Gil, "HgCdTe Double Heterostructure Diode Lasers Grown by Molecular Beam Epitaxy", *J. Vac. Sci. Technol.*, 1992, B 10, p. 1587; A. Ravid and A. Zussman, "Laser Action and Photoluminescence in an Indium-Doped n-type $Hg_{1-x}Cd_xTe$ (x=0.375) Layer Grown by Liquid Phase Epitaxy", *J. Appl. Phys.*, 1993, 73, p. 3979). However, by comparison with research on III-V and II-VI semiconductor materials and devices, research on IV-VI semiconductor materials and devices has lagged. Consequently, techniques that may prove successful in improving the performance of IV-VI semiconductor lasers have yet to be explored.

Maximum operating temperature is presently considered the most important limiting factor for IV-VI semiconductor tunable diode lasers. The highest-known operating temperature for devices operated in continuous wave (cw) mode, which is preferred over pulsed mode for infrared spectroscopy applications, is 203K for a laser emitting in the 3.5 µm range (Z. Feit, D. Kostyk, R. J. Woods, and P. Mak, "Single-Mode Molecular Beam Epitaxy Grown PbEuSeTe/PbTe Buried Heterostructure Diode Lasers for $Co_2$ High-Resolution Spectroscopy", *Appl. Phys. Lett.*, 1991, 58, p. 343). Longer wavelength devices have even lower maximum operating temperatures. Thus, low operating temperatures necessitate the use of cumbersome liquid nitrogen or liquid helium cooling systems in spectrometers based upon these laser devices. A low laser operating temperature also limits the tuning range of individual devices. If TDL operating temperatures can be increased to above 220 to 230K then thermoelectric cooling (TEC) modules could be used enabling a significant simplification of TDL spectrometer instrumentation. Any increase in maximum operating temperature will also expand TDL tuning range, thus further simplifying TDL spectrometer operation.

Thermal modeling of IV-VI semiconductor lasers (R. Rosman, A. Katzir, P. Norton, K. H. Bachem, and H. Preier, "On the Performance of Selenium Rich Lead-Salt Heterostructure Laser with Remote p-n Junction", *IEEE J. Quantum Electronics*, 1987, QE-23, p.94) shows that there is a large difference under maximum operating temperature conditions, as much as 60 degrees, between the heat sink temperature and the active region temperature. This thermal gradient is reflected in the maximum operating temperature difference between pulsed and cw operation, observed to be as much as 120 degrees (B. Spanger, U. Schiessl, A. Lambrecht, H. Böttner, and M. Tacke, "Near-Room-Temperature Operation of $Pb_{1-x}Sr_xSe$ Infrared Diode Lasers Using Molecular Beam Epitaxy Techniques", *Appl. Phys. Lett.*, 1988, 53, p. 2582). Improving heat removal from the active region would therefore lead to an increase in the maximum operating temperatures of IV-VI semiconductor lasers. The major factor limiting heat dissipation from the active region is the substrate which is still attached to the laser structure.

A substrate removal procedure has been developed for III-V semiconductor laser fabrication by E. Yablonovitch, E. Kapon, T. J. Gmitter, C. P. Yun, and R. Bhat, in "Double Heterostructure GaAs/AlGaAs Thin Film Diode Lasers on Glass Substrates", IEEE Photonics Tech. Lett., 1989, 1, p. 41. According to this technique, an AlGaAs/GaAs/AlGaAs laser structure is grown upon a GaAs substrate with a 500 Å AlAs selectively etchable release layer interposed between the substrate and laser structure. The laser structure is then supported from above by Apiezon W™ wax ("black wax") while the AlAs layer is etched with dilute HF. This "epitaxial lift-off" (ELO) process, which was developed to enable hybrid device packaging, does not degrade the performance of the laser device. Other examples of methods of epitaxial liftoff are seen in F. Agahi, K. M. Lau, A. Baliga, D. Loeber, and N. Anderson, "Photo-Pumped Strained-Barrier Quantum Well Lasers Fabricated by Epitaxial Liftoff", ISDRS, University of Virginia, Charlottesville, Va. (1993); C. Camperi-Ginestet, M. Hargis, N. Jokerst and M. Allen, "Alignable Epitaxial Liftoff of GaAs Materials with Selective Deposition Using Polyimide Diaphragms", IEEE Transactions Photonic Tech. Lett., Vol. 3, No. 12, pgs. 1123–1126, December 1991; and E. Yablonovitch, E. Kapon, T. J. Gmitter, C. P. Yun and R. Bhat, "Double Heterostructure GaAs/AlGaAs Thin Film Diode Lasers on Glass Substrates, IEEE Photonic Tech. Lett., Vol. 1, No. 2, pgs. 41–42, February 1989.

However, epitaxial-lift off methods using wax are difficult, time-consuming, require extra handling steps and are not readily adaptable to mass production techniques. A method for producing a laser not confined to the limitations of epitaxial lift-off using the wax method and which resulted in the production of a laser operable at higher temperatures would be desirable.

DESCRIPTION OF THE DRAWINGS

FIG. 2 is a perspective view of a plurality of plates used in the cleaving assembly.

FIG. 3 is a perspective view of a cleaving assembly used in accordance with the present invention.

FIG. 4A is a perspective view of an alternate version of a cleaving assembly, partially assembled.

FIG. 4B is a perspective view of the cleaving assembly of FIG. 4A completely assembled.

FIG. 5A is a perspective view of an epitaxial layer grown upon a substrate.

FIG. 5B is an enlarged detail view of the epitaxial layer of FIG. 5A.

FIG. 6 is a perspective view of a cleaving assembly having a bonding layer.

FIG. 7 is a perspective view of an epitaxial layer-substrate assembly with a bonding layer disposed thereon.

FIG. 8 is a perspective view of an epitaxial layer-substrate assembly bonded to a cleaving assembly.

FIG. 9 is a perspective view of an epitaxial layer cleaving assembly after substrate removal.

FIG. 10 shows a single plate, with a bonded epitaxial layer, detached from the cleaving assembly.

FIG. 11 shows a single laser bar cut from a detached plate.

FIG. 12 shows a perspective view of a laser bar with an insulating layer.

FIG. 13 shows a perspective view of a laser bar mounted upon a metal cold finger.

FIG. 17 shows the epitaxial layer of FIG. 16 with a layer of $BaF_2$ evaporated thereupon.

FIG. 18 shows the epitaxial layer of FIG. 17 after photoresist removal.

FIG. 19 shows the epitaxial layer of FIG. 18 after application of a layer of bonding metal.

FIG. 20 is a perspective view of a laser bar having a plurality of single mode waveguides.

DESCRIPTION OF THE INVENTION

Figure 1:
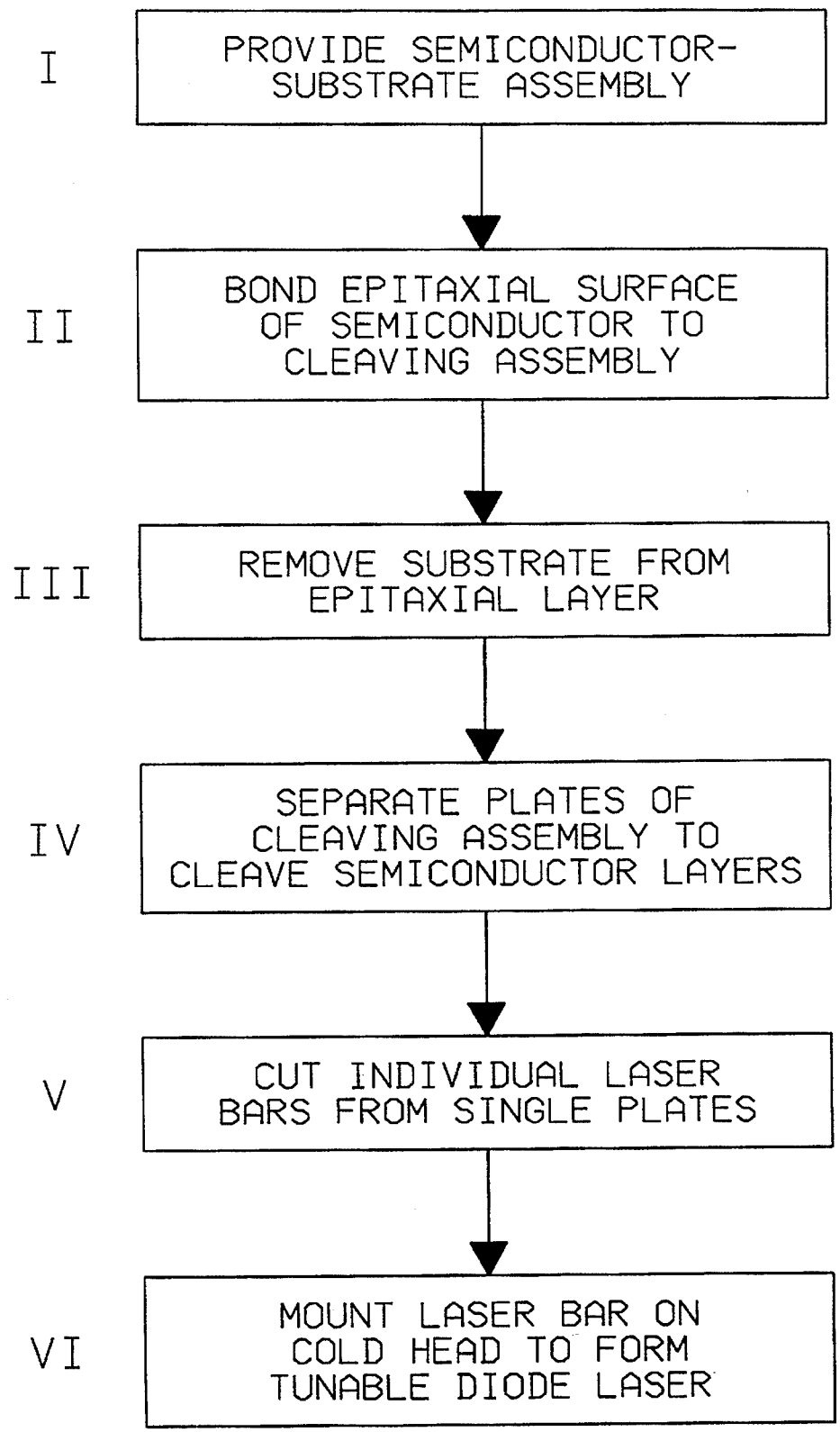
FIG. 1 is a flow chart outlining the processing steps of the present invention.

An objective of the present invention is to provide a laser having increased heat dissipation from the lasing region, thus allowing higher operating temperatures, and thereby optimizing cooling requirements. It is projected that by improving heat removal from the active region of the laser, the IV-VI semiconductor TDL maximum cw operating temperatures can be increased by more than 50K, thereby placing a considerable portion of the TDL operating temperature range within the effective range of thermoelectric cooling devices.

There has been a considerable need for improving heat dissipation from the active region of TDL devices due to the fact that IV-VI semiconductors have extremely low thermal conductivities, (see Table I).

TABLE I

| Thermal conductivities (watt/cm K.) of various materials at 300 K. | | | | | | |
|---|---|---|---|---|---|---|
| PbSe | PbTe | $BaF_2$ | GaAs | Silicon | Copper | CVD Diamond |
| 0.018 | 0.023 | 0.329 | 0.60 | 1.412 | 5.0 | >10.0 |

All previous IV-VI semiconductor TDLs have been packaged with relatively thick (~250 μm) PbTe substrates still attached to the device structure. Since PbTe is 217 times less thermally conductive than copper, heat is effectively removed from only one side of the device (the non-substrate side). By eliminating the substrate entirely and placing a second heat sink within microns of the active region, as is shown in the present invention, heat dissipation is effectively doubled. Thermal modeling results show that maximum TDL operating temperatures increase by more than 60 degrees when this second copper heat sink is used, a realistic value considering the work of R. Rosman, A. Katzir, P. Norton, K. H. Bachem, and H. Preier, "On the Performance of Selenium Rich Lead-Salt Heterostructure Laser with Remote p-n Junction", IEEE J. Quantum Electronics, 1987, QE-23, p.94. Use of the method of TDL fabrication procedure shown herein should increase maximum cw operating temperatures to greater than 260K.

The present invention, therefore, comprises a method for producing a tunable semiconductor diode laser using a IV-VI semiconductor material wherein the growth substrate has been removed (III-V and II-VI semiconductor materials may also be used). The overall process is described briefly in the flow chart shown in FIG. 1. In Step I, a cleaving assembly and a semiconductor epitaxial layer (or layers) which has been grown on an appropriate substrate by methods well known to one of ordinary skill in the art is provided. The exposed surface of the semiconductor epitaxial layer is then bonded to a prepared surface of the cleaving assembly, which is composed of a plurality of connected plates (Step II). The substrate is then removed, leaving only the semiconductor epitaxial layers bonded to the cleaving assembly (Step III). The single plates of the cleaving assembly are separated individually, causing the epitaxial layers to cleave along parallel crystallographic planes such as {100} or {110} planes (Step IV). Individual laser bars are then cut, if necessary, from each plate (Step V). The laser bar is then mounted on a cold head to form a packaged tunable diode laser (Step VI).

More particularly, the present invention comprises a method of producing a semiconductor laser device. The first step comprises providing a semiconductor epitaxial layer grown on a substrate. Next, a cleaving assembly having at least one cleaving portion is provided. The semiconductor epitaxial layer is bonded to the cleaving assembly wherein at least a portion of the semiconductor epitaxial layer is bonded to the cleaving portion or plate of the cleaving means and an adjacent portion of the semiconductor epitaxial layer is bonded to an adjacent portion of the cleaving assembly (which may be an adjacent cleaving portion or plate) which is adjacent the cleaving portion. Following this, the substrate is removed from the semiconductor epitaxial layer. Finally, the cleaving portion or plate is separated from the cleaving assembly wherein the portion of the semiconductor epitaxial layer bonded to said cleaving portion is cleaved from the adjacent portion of the semiconductor epitaxial layer. These steps may be repeated for additional cleaving portions or plates which may comprise the cleaving assembly. These steps form Fabry-Perot laser cavities in the semiconductor epitaxial layer resulting in a semiconductor laser device comprising a heat conductive portion derived from the cleaving portion and a laser portion derived from the epitaxial layer.

In a preferred version of the invention, the method has an initial step of providing a semiconductor assembly having an epitaxial layer grown on a substrate. The epitaxial layer has an upper surface with an epitaxial bonding layer disposed thereon. A cleaving means, more particularly a cleaving jig, comprising a plurality of detachably connected plates is provided. Each plate has an end surface, which end surfaces cooperate to form a cleaving jig bonding surface which has a cleaving jig bonding layer disposed thereon.

In the next step, a cleaving jig-semiconductor assembly is formed by bonding the epitaxial bonding layer of the semiconductor assembly to the bonding layer of the cleaving jig wherein is formed a bonding layer between the cleaving jig bonding surface and the upper surface of the epitaxial layer. Following this, the substrate is removed from the cleaving jig-semiconductor assembly. Finally, a plate is disconnected from the cleaving jig-semiconductor assembly wherein the epitaxial layer bonded to the plate is cleaved from a portion of the epitaxial layer bonded to an adjacent plate. This disconnection step forms a semiconductor laser cavity (Fabry-Perot) device comprising a plate portion which is heat conductive and a semiconductor portion.

This process may be followed by the additional step of cutting the semiconductor laser device into a plurality of laser bars wherein each laser bar comprises a plate portion and a semiconductor portion. Further, in the process, the step of providing a semiconductor assembly may be preceded by the additional step of applying the epitaxial bonding layer to the upper surface of the epitaxial layer. Also, the step of providing a cleaving jig may be preceded by the additional step of applying the cleaving jig bonding layer to the cleaving jig bonding surface. The plates may be further defined as being made from metal or from diamond. Additionally, an isolating layer for electrically isolating the laser bar may be applied to a portion of the plate portion of the laser bar. Finally, the laser bar thus electrically isolated may be disposed upon a cold finger whereby the isolating layer of the laser bar is disposed upon a mounting surface of the cold finger and the semiconductor portion of the laser bar is disposed adjacent a laser facing surface of the cold finger. A second cold finger, which also may be comprised of metal or diamond, may be disposed upon a portion of the laser bar for further enhancing heat dissipation.

The epitaxial layer may be a IV-VI, III-V or II-VI semiconductor. Further, the semiconductor assembly may further comprise a release layer positioned between the epitaxial layer and the substrate. Further, the laser bar may be further defined as having a semiconductor portion tunable within a range of from about 3 to about 30 micrometers. Further, the epitaxial layer of the semiconductor assembly may further comprise at least one single mode waveguide region. The plate of the cleaving jig may be further defined as having a thickness in a range of from about 100 to about 1000 micrometers.

The semiconductor laser assembly produced by the method of the present invention comprises (1) a cold finger having a mounting surface, and (2) a semiconductor laser having (a) a heat conductive portion having an end surface and a mounting surface, and (b) a semiconductor epitaxial layer having a bonding surface and an exposed end surface. In the semiconductor laser, the bonding surface of the epitaxial layer is bonded to the end surface of the heat conductive portion. The semiconductor laser is mounted upon the cold finger by engaging the mounting surface of the semiconductor laser with the mounting surface of the cold finger. The heat conductive portion of the semiconductor laser in one version of the invention is metal. The heat conductive portion of the semiconductor laser in another version of the invention is diamond. Further in a preferred version of the invention, the cold finger is comprised of metal.

The semiconductor laser assembly may further comprise an isolating layer disposed between the mounting surface of the semiconductor laser and the cold finger which serves to electrically isolate the mounting surface of the semiconductor laser from the cold finger. The assembly may further comprise a first electrical lead attached to a portion of the cold finger and a second electrical lead attached to the heat conductive portion of the semiconductor laser. The cold finger may further comprise a laser facing surface adjacent or against which the exposed end surface of the semiconductor epitaxial layer is disposed.

The semiconductor laser assembly may further comprise a second cold finger disposed upon a second contact surface of the heat conductive portion of the semiconductor laser. Portions of the second cold finger which are adjacent the first cold finger are electrically isolated from the first cold finger. This embodiment of the semiconductor laser assembly may further comprise a first electrical lead and a second electrical lead. In such case, each lead is attached to a separately isolated electrically conductive portion of the semiconductor laser assembly. At least one version of the semiconductor laser assembly described above may further comprise an optical pumping means for inducing emission of laser light. Any of the versions of the semiconductor laser device described herein may be installed in a spectrometer equipped to receive such a device.

The cleaving means used in a preferred version of the present invention is a cleaving jig comprising a plurality of metal plates. Each metal plate has a first facing surface, a second facing surface, a first side surface, a second side surface, an upper end surface and a lower end surface. The plurality of plates are positioned against each other such that each plate has at least one facing surface disposed against a facing surface of an adjacent plate. The lower end surfaces of the plurality of plates are all oriented in the same plane. The cleaving jig further comprises a connecting assembly which detachably connects the plurality of adjacently disposed plates into a plate assembly having a first end and a second end and wherein the lower end surfaces of the plates cooperate to form a bonding surface for bondingly connecting a semiconductor epitaxial layer to the plate assembly.

The connecting assembly may further comprise at least a first screw with screw threads and a second screw with screw threads. Each plate further comprises at least a first hole and a second hole through which the first screw and second screw are driven for connecting the plates and forming the plate assembly.

The cleaving jig may further comprise a first end block plate positioned at the first end of the plate assembly and a second end block plate positioned at the second end of the plate assembly. The second end block plate has a pair of holes with screw threads for matingly engaging the screw threads of the first screw and the second screw when the first screw and second screw are inserted through the first holes and second holes of the plates. The cleaving jig may further comprise a metallic bonding layer disposed upon the bonding surface.

A more detailed description of the process of fabricating the apparatus is provided below and in FIGS. 2–20.

Laser Fabrication

Shown in FIGS. 2 and 3 is a plurality of metal plates 10 which comprise subunits of a cleaving jig. Each metal plate 10, or cleaving portion, comprises an upper end 12, a lower end 14, a front surface 16, a rear surface 18, an upper side 20, a lower side 22, a first lateral side 24 and a second lateral side 26. Each plate 10 further has a height 28 which extends from the upper end 12 to the lower end 14, a width 30 which extends from the first lateral side 24 to the second lateral side 26 and a thickness 32 which extends from the front surface 16 to the rear surface 18. Each plate 10 further comprises a first hole 34a extending from the front surface 16 to the rear surface 18 and a second hole 34b in a different position in the plate 10 parallel to the first hole 34a. A first connector 36a and a second connector 36b are inserted through the holes 34a and 34b, respectively, of the plurality of plates 10, thereby forming the plates 10 into a cleaving jig 38. Together the upper sides 20 of the plates 10 of the jig 38 form an upper surface 40 of the jig 38. Each plate 10 is made from a high conductivity metal, preferably an oxygen-free high conductivity copper. As noted above, the plates 10 could be made from high thermal conductivity diamond, therefore, it will be understood that where used herein, the term metal can be substituted for by the word diamond. The thickness 32 of the plate 10 ultimately determines the length of the cavity of the laser. The thickness 32 is generally from about 100 to 1000 micrometers and more preferably from 300 to 1000 micrometers.

Shown in FIGS. 4A and 4B and represented by the general reference numeral 38a is an alternative version of the cleaving jig of the present invention. The jig 38a is the same as the jig 38 except that the plates 10 are sandwiched between a first end block 42a and a second end block 42b. First end block 42a has holes 34a and 34b which are counter bored and second end block 42b has holes 34a and 34b which are threaded for threadly engaging the threads of the connecting screws 36a and 36b. The heads of the connecting screws 36a and 36b can be recessed within the counter bored holes 34a and 34b of the first end block 42a. Shown in FIG. 4B is the completely assembled cleaving jig 38a. The jig 38a can be held in a milling device to allow milling of the edges of the plates to create a flush and uniform assembly of plates 10.

Shown in FIG. 5A is a semiconductor-substrate assembly 46 comprising a semiconductor epitaxial layer 48, which may further comprise a plurality of layers such as layers 48a, 48b and 48c as shown in FIG. 5B and as is well known to one of ordinary skill in the art. The layer 48 has a thickness 50 which preferably is from about 3 to 5 micrometers. The semiconductor-substrate assembly 46 further comprises a substrate 52 which in one version is silicon and which has a thickness 54, and a release layer 56 which in one embodiment is $BaF_2$ and which is disposed between the epitaxial layer 48 and the substrate 52 and which has a thickness 58. The semiconductor-substrate assembly 46 also has an upper exposed surface 60 which is the outermost layer of the epitaxial layer 48.

Shown in FIG. 6 is a cleaving jig 38 to which a bonding layer 62 has been applied by standard thermal evaporation techniques over the jig surface layer 40. The jig bonding layer 62 has a thickness 64 and an upper surface layer 66. Shown in FIG. 7 is a semiconductor-substrate assembly 46 to which a semiconductor bonding layer 68 has been applied by standard thermal evaporation techniques over the upper surface layer 60. The bonding layer 68 has a thickness 70 and an upper surface layer 72. Shown in FIG. 8 is a jig-semiconductor-substrate assembly 74 comprising a jig assembly 38 which is bonded to a semiconductor-substrate assembly 46 via a jig-semiconductor bonding layer 76 located between the upper surface 42 of the cleaving jig 38 and the upper surface 60 of the semiconductor-substrate 46. The jig 38 and semiconductor substrate assembly 46 are bonded to one another at a temperature of generally greater than about 235° C. The resulting jig-semiconductor bonding layer 76 has a thickness 78.

In the process of the present invention, the bonding layers 66 and 72 will preferably use a gold/tin eutectic bonding medium each having a thickness of about ½ micrometer, such as that described in: G. S. Matijasevic, C. C. Lee, C. Y. Lee, "Au-Sn Alloy Phase Diagram and Properties Related to Its Use as a Bonding Medium", Thin Solid Films, 1993, 223, p. 276 which is hereby incorporated herein by reference. Preferably, the thickness 78 of the bonding layer 76 is about one micrometer or less to allow cleavage of the bonding layer 76. It will be understood by one of ordinary skill in the art that the bonding layers 66 and 72 may each be comprised of a plurality of layers of bonding material.

Shown in FIG. 9 is a jig-semiconductor assembly 80 which is obtained when the substrate 52 is removed from the jig-semiconductor substrate assembly 74 by etching away or dissolving the release layer 56 in a manner known to one of ordinary skill in the art. The jig-semiconductor assembly 80 comprises the cleaving jig 38 which is bonded via the bonding layer 76 to the epitaxial layer 48. Also represented in FIG. 9 by dashed lines extending below the cleaving plates are a plurality of cleavage planes 82 which extend substantially perpendicularly through the epitaxial layer 48. After removal of the substrate 52 to form the jig-semiconductor assembly 80, the connectors 36a and 36b are removed, then each plate 10 can be detached from the adjacent plate 10 of the assembly 80 by sliding the plate 10 such that the epitaxial layer 48 is cleaved along {100} or {110} cleavage planes 82 to form a plate-semiconductor assembly 84 represented in FIG. 10. The plate-semiconductor assembly 84 has a height 86 which extends from the exposed lower surface 87 of the epitaxial layer 48, through the bonding layer 76 to the lower side 22 of the plate 10.

Shown in FIGS. 11 and 12 is a laser bar 88 which has been cut from the plate-semiconductor assembly 84 by cutting from the lower side 22 of the plate 10 through the plate 10 through the epitaxial layer 48. The laser bar 88 thus has a plate portion or metal finger portion 89 and a semiconductor laser portion 90. The semiconductor laser portion 90 may be comprised of a plurality of layers shown in FIGS. 10–11 as layers 90a, 90b and 90c. It will be understood by one of ordinary skill in the art that the semiconductor laser portion 90 may comprise more or fewer than the three layers 90a, 90b and 90c shown in FIGS. 11 and 12. The laser bar 88 has a cavity length 91 which is preferably in the range of from 100 to 1000 micrometers, more preferably between 300 and 1000 micrometers, a height 92 which may be from about 500 micrometers to as much as 1 centimeter, and an overall length 93. The metal finger portion 89 of the laser bar 88 has an end 94 with an end surface 96. The semiconductor laser portion 90 has an end 98. The laser bar 88 has a front surface 100, a rear surface (not shown), a first side surface 102 and a second side surface 104. In FIG. 12, the laser bar 88 is shown with an isolating layer 106 which has been disposed upon a portion thereof, preferably the first side surface 102. The isolating layer 106 isolates the metal finger portion 89 of the laser bar 88 enabling it to serve as an electrode. The isolating layer 106 could be either a thin plate of thermally conductive sapphire or a wafer of chemically vapor deposited (CVD) diamond or other suitable electrically isolating material. CVD diamond wafers are commercially available, for example, from Harris Diamond Corp., Arlington, N.J. or Norton Diamond Film, Northboro, Mass. (see G. Lu and E. F. Borchelt, "CVD Diamond Boosts Performance of Laser Diodes", *Photonics Spectra*, September 1993, p. 88). With thermal conductivities more than twice that of copper, CVD diamond will assist in the dissipation of heat from the laser active region.

After the isolating layer 106 has been applied, the laser bar 88 is disposed upon a metallic electrode 108 of a metal cold finger 110 as shown in FIG. 13 in a manner well known in the art resulting in a laser assembly generally referred to by reference numeral 112. The laser assembly 112 may have electrical leads 114 and 116 connected to the metal finger 89 and to the metal electrode 108. Moreover, the metal electrode 108 and the cold finger 110 may be integral to each other forming in essence a unitary electrode. The laser assembly 112 can then be installed in an instrument for use in spectroscopic applications known generally in the art such as those cited above and in the article by R. S. Eng, J. F. Butler and K. J. Linden; "Tunable Diode Laser Spectroscopy: An Invited Review", *Optical Engineering*, Vol. 19, No. 6, pgs. 945–960, 1980. For example, the laser assembly 112 could be installed in a tunable diode laser system for high resolution spectroscopy (FIG. 1.6 in Eng et al. cited above).

An additional metal heat sink may be disposed over the second side surface 104 to further increase the heat dissipation from the lasing region as further explained below.

Figure 14:
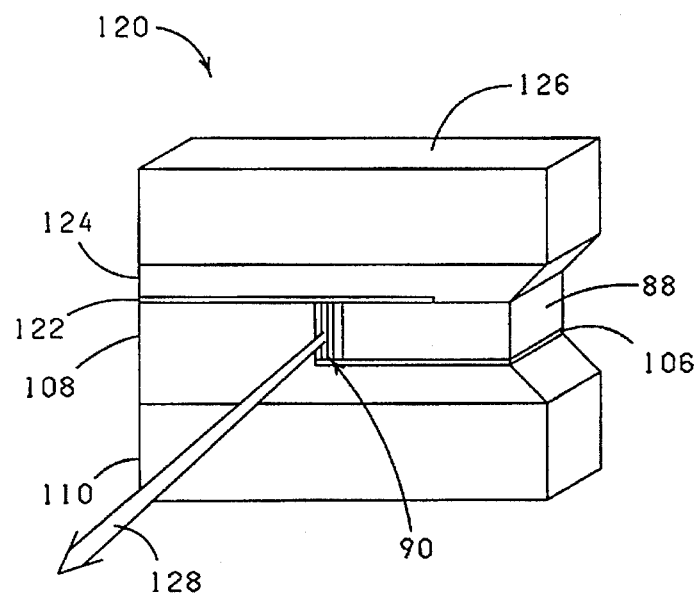
FIG. 14 shows a perspective view of the semiconductor laser device with a second metal cold finger.

Shown in FIG. 14, and referred to generally by the reference numeral 120 is a dual heat sink laser assembly. The dual heat sink laser assembly 120 is exactly the same as the laser-cold finger assembly 112 described above except that it further comprises a second isolating layer 122, a second metallic electrode 124, and a second cold finger 126. The second isolating layer 122 is disposed between the semiconductor laser portion 90 and the first metallic electrode 108. The second metallic electrode 124 is disposed upon a portion of the laser bar 88 to form an electrical contact therewith. The second cold finger 126 is in turn disposed upon the second metallic electrode 124 generally as indicated in FIG. 14. The arrow 128 generally indicates the direction of light emission from the laser diode 120.

Figure 15:
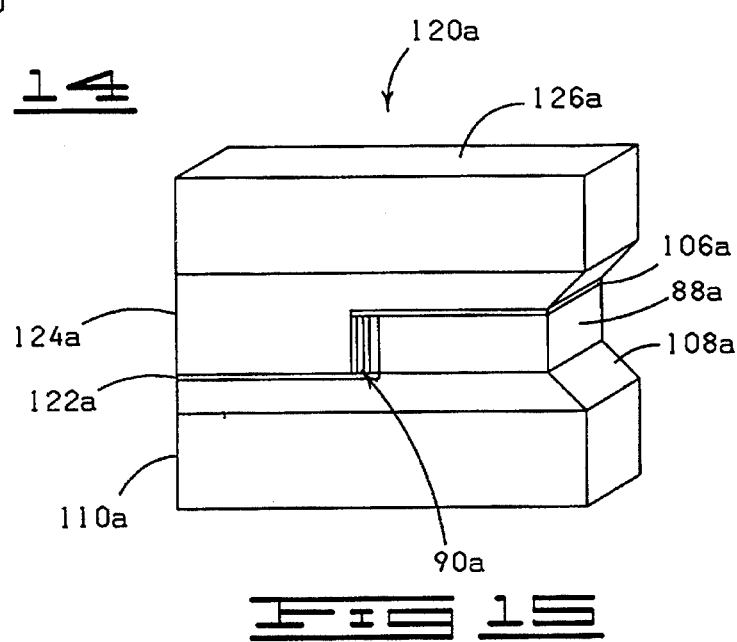
FIG. 15 shows a perspective view of an alternate version of a semiconductor laser with a second metal cold finger.

Shown in FIG. 15 and referred to generally by the reference numeral 120a is an alternate version of a dual heat sink laser assembly. The laser assembly 120a is exactly the same as the laser assembly 120 except for the orientation of the isolating layers which separate the two electrode portions of the laser assembly. In this version, a laser bar 88a having a semiconductor portion 90a has an isolating layer 106a disposed upon an upper surface thereof. The lower surface of the laser bar 88a is contactingly disposed upon a mounting surface of a metallic electrode 108a which is itself mounted upon a metal cold finger 110a. A second isolating layer 122a separates the metallic electrode 108a from a second metallic electrode 124a which is disposed upon the laser bar 88a in a position such that the isolating layer 106a separates the metallic portion of the laser bar 88a from the second metallic electrode 124a. A second metal cold finger 126a may be disposed upon the second metallic electrode 124a.

It will be understood by one of ordinary skill in the art that the cold fingers, metallic electrodes, and isolating layers may be arranged in a variety of configurations which differ from the configuration shown in FIGS. 14 and 15. It will be understood by one of ordinary skill in the art that the metallic electrodes 108 and 108a and the cold fingers 110 and 110a may comprise a single functional unit such that each cold finger 110 or 110a itself may comprise the electrode 108 or 108a, respectively. This is also true for the second cold fingers 126 and 126a and second metallic electrodes 124 and 124a. In such cases the terms metallic electrode and cold finger may be used interchangeably and either may be generally referred to as a "metal electrode".

The semiconductor diode lasers may also be driven by optical pumping in a manner well known to one of ordinary skill in the art. Optically pumped devices have the advantage of needing neither p-n junctions nor electrical contacts. Since electric current is not driven through the device, lasing can be achieved at higher operating temperatures. High power near-infrared III-V semiconductor diode lasers or even LEDs may be used as pump sources for IV-VI semiconductor lasers, for example.

Semiconductor/Substrate Assemblies

By way of further explanation, an example of a IV-VI semiconductor/substrate assembly 46 is the $Pb_{1-x}Sn_xSe_{1-y}Te_y$ system. This pseudobinary alloy can be used as the active region in lasers designed to operate in the 6 to 30 μm spectral range. Most IV-VI semiconductor DH and BH lasers have been fabricated with $PbSe_{1-y}Te_y$ ternary and $Pb_{1-x}Sn_xSe_{1-y}Te_y$ quaternary layers lattice matched with $Pb_{1-x}Sn_xTe$ substrates (Y. Horikoshi, M. Kawashima, and H. Saito, "PbSnSeTe-PbSeTe Lattice-Matched Double Heterostructure Lasers", *Japanese J. Appl. Phys.*, 1982, 21, p. 77;

and A. Shahar and A. Zussman, "PbSnTe-PbTeSe Lattice Matched Single Heterostructure Diode Lasers Grown by LPE on a (111) Oriented PbSnTe Substrates", *Infrared Physics.*, 1987, 27, p. 45).

Work has also been done with $Pb_{1-x}Sn_xSe_{1-y}Te_y$ quaternary layers lattice matched with PbSe substrates (P. J. McCann, J. Fuchs, Z Feit, and C. G. Fonstad, "Phase Equilibria and Liquid Phase Epitaxy Growth of PbSnSeTe Lattice Matched to PbSe", *J. Appl. Phys.*, 1987, 62, p. 2994; and H. Preier, A. Feit, J. Fuchs, D. Kostyk, W. Jalenak, and J. Sproul, "Status of Lead Salt Laser Development at Spectra-Physics", presented at the Second International Symposium on Monitoring of Gaseous Pollutants by Tunable Diode Lasers, November, 1988).

Such epitaxial structures, when grown on $Pb_{1-x}Sn_xTe$ or PbSe substrates, are usually fabricated into laser devices by cleaving the entire layer/substrate structure along {100} planes to form Fabry-Perot cavities.

Another example of a semiconductor substrate assembly 46 consists of three LPE layers grown on a $BaF_2$ substrate. An example of a method of growing an epitaxial layer on $BaF_2$ is provided in U.S. Ser. No. 07/367,459, entitled "A Chemical Method for the Modification of Substrate Surface to Accomplish Heteroepitaxial Crystal Growth", by P. J. McCann and C. G. Fonstad, filed Jun. 16, 1989, and which is hereby incorporated herein by reference.

Cleavage of the entire epitaxial layer/substrate structure along {100} planes would be difficult with a IV-VI semiconductor/$BaF_2$ structure since $BaF_2$ tends to cleave along {111} planes. In the present invention, this problem is solved for $BaF_2$ substrate-grown epitaxial layers by removing the $BaF_2$ substrate before cleaving the laser structure. Removing the $BaF_2$ substrate without chemically attacking the laser structure is possible since $BaF_2$ is soluble in water while IV-VI semiconductor epitaxial layers are not. An acid solution, preferably a 1:3 $HCl:H_2O$ solution, which dissolves $BaF_2$ 30 times faster than water alone, could also be used to accelerate substrate removal. Besides having a compatible crystal structure and lattice matching capabilities, $BaF_2$ is an attractive substrate material for IV-VI semiconductor epitaxy and device development because its thermal expansion coefficient is nearly the same as that of the IV-VI semiconductors. Although $BaF_2$ substrates have been used for IV-VI semiconductor vapor phase epitaxy since 1970 [19] (H. Holloway and E. M. Logothesis, "Epitaxial Growth of Lead Tin Telluride", *J. Appl. Phys.*, 1970, 41, p. 3543), LPE growth of IV-VI semiconductors on $BaF_2$ substrates has only recently been accomplished.

Heat dissipation could be also be enhanced by placing a thermoelectric cooler near the device in a manner well known in the art. The thermal properties of such a device are considered optimal for enabling high temperature TDL operation. Thermoelectric coolers are commercially available, for example, the "Frigichip" is available from Melcor, Inc., Trenton, N.J. Another type of TEC is available from Marlow Industries, Inc., Dallas, Tex.

The fabrication procedure outlined in FIGS. 2–15 yields broad area lasers, but can be modified to yield single mode lasers, desired for most infrared spectroscopy applications.

Figure 16:
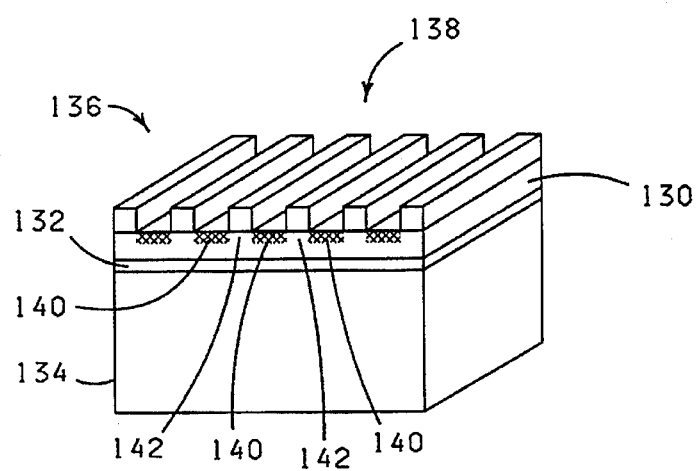
FIG. 16 shows a perspective view of an epitaxial layer after for proton bombardment for producing a plurality of single mode waveguides.

FIGS. 16–20 show the production of a semiconductor laser device having an array of waveguides for high power single-mode lasers. FIG. 16 shows a IV-VI semiconductor epitaxial layer 130 bonded via a $BaF_2$ buffer layer 132 to a substrate (e.g., silicon) 134. An array of photoresist material 136 is disposed upon the upper exposed surface of the epitaxial layers 130. The epitaxial-substrate-photoresist assembly 138 is subjected to a treatment such as proton bombardment which induces in the epitaxial layers regions 140 each having lower indexes of refraction than the unaffected portions of the epitaxial layer 130. Areas of the epitaxial layer 130 protected from proton bombardment by the photoresist material 136 serve as the single-mode waveguide regions 142 of the laser in a manner well known to one of ordinary skill in the art.

FIG. 17 shows an epitaxial-substrate-photoresist assembly 138 upon which a layer 144 of $BaF_2$ has been evaporated. The $BaF_2$ is applied to the assembly 138 to cover the lower index of refraction regions 140, as indicated in FIG. 18 wherein is shown an epitaxial-substrate assembly 146 after the photoresist material 136 has been removed. Shown in FIG. 19 is an epitaxial-substrate assembly 146 upon which a bonding layer 148 has been applied. The bonding layer 148 may be exactly the same as the bonding layer 68 described above in FIG. 7.

The epitaxial layer-substrate assembly 146 having the bonding layer 148 is then ready to be bonded to a cleaving jig for producing a semiconductor laser in a manner exactly as described above in the steps corresponding to FIGS. 8–13.

The layers 144 which remain on the epitaxial substrate assembly 146 shown in FIG. 17 can be protected from dissolution during the substrate removal step by bordering the exposed $BaF_2$ regions with a layer of photoresist material (not shown) such that the $BaF_2$ stripes do not extend all the way to the edge of the epitaxial layer.

Shown in FIG. 20 is a laser bar 150 comprising a metal finger portion 152 and a single-mode waveguide semiconductor laser portion 154. The laser bar 150 can then be used in exactly the same way as the laser bar 88 described above.

Laser fabrication from molecular beam epitaxy (MBE)-grown material on silicon substrates can be accomplished using the same epitaxial layer lift-off procedures that have been developed for III-V laser fabrication. Instead of AlAs, though, the $BaF_2$ buffer layer will function as the release layer. After eliminating the silicon substrate, the same procedure as outlined in above FIGS. 8–12 can then be used to fabricate laser devices. Since there is no thick PbTe substrate, such devices will exhibit the same superior active region heat dissipation as LPE-grown lasers fabricated using the $BaF_2$ substrate removal technique. Because MBE technology can produce larger bandgap $Pb_{1-x}Eu_xSe_{1-y}Te_y$ alloys and has greater growth flexibility than LPE it offers the best promise for fabrication of TDLs that operate near room temperature. MBE growth combined with focused ion beam etching, through the use of a portable load-lock vacuum chamber, will also allow the fabrication of advanced laser devices such as high power buried heterostructure arrays.

Each of the patents, pending patent applications, and publications cited herein is hereby incorporated herein by reference.

Changes may be made in the construction and the operation of the various components, elements and assemblies described herein or in the steps or the sequence of steps of the methods described herein without departing from the spirit and scope of the invention as defined in the following claims.

What is claimed is:

1. A cleaving assembly for producing a semiconductor laser, comprising:

a plurality of plates, each plate having a first facing surface, a second facing surface, a first side surface, a second side surface, an upper end surface and a lower end surface; and connecting means for detachably connecting the plates into a plate assembly having a first end and a second end, and wherein when the plates are detachably connected into the plate assembly, the plates are positioned against each other such that each plate has at least one facing surface disposed against a facing surface of an adjacent plate and wherein the lower end surfaces of the plates are all oriented in the same plane and cooperate to form a bonding surface, the bonding surface having a semiconductor epitaxial layer bonded thereto.

2. The cleaving assembly of claim 1 wherein the connecting means further comprises at least a first screw with screw threads and a second screw with screw threads and wherein each plate further comprises at least a first hole and a second hole through which the first screw and second screw are driven for connecting the plates into a plate assembly.

3. The cleaving assembly of claim 2 further comprising a first end block plate positioned at the first end of the plate assembly and a second end block plate positioned at the second end of the plate assembly and wherein the second end block plate has a pair of holes with screw threads for matingly engaging the screw threads of the first screw and the second screw when the first screw and second screw are inserted through the first holes and second holes of the plates.

4. The cleaving assembly of claim 1 further comprising a metallic bonding layer disposed upon the bonding surface for bonding the epitaxial layer to the cleaving assembly.

5. The cleaving assembly of claim 1 wherein the semiconductor epitaxial layer is disposed upon a substrate.

6. The cleaving assembly of claim 1 wherein the plates are metallic.

7. The cleaving assembly of claim 1 wherein the plates are diamond.

8. A cleaving assembly for producing a semiconductor laser, comprising:

a plate assembly having a first end and a second end and comprising a plurality of plates, each plate having a first facing surface, a second facing surface, a first side surface, a second side surface, an upper end surface and a lower end surface and wherein the plates in the plate assembly are positioned against each other such that each plate has at least one facing surface disposed against a facing surface of an adjacent plate and wherein the lower end surfaces of the plates are all oriented in the same plane and cooperate to form a bonding surface, the bonding surface having a semiconductor epitaxial layer bonded thereto; and a first end block plate disposed adjacent the first end of the plate assembly and a second end block plate disposed adjacent the second end of the plate assembly, the first end block plate and the second end block plate cooperating to hold the plurality of plates together as the plate assembly.

9. The cleaving assembly of claim 8, further comprising a metallic bonding layer disposed upon the bonding surface for bonding the epitaxial layer to the cleaving assembly.

10. The cleaving assembly of claim 8 wherein the semiconductor epitaxial layer is disposed upon a substrate.

11. The cleaving assembly of claim 8 wherein the plates are metallic.

12. The cleaving assembly of claim 8 wherein the plates are diamond.

13. A cleaving assembly for producing a semiconductor laser, comprising:

a plurality of plates, each plate having a first facing surface, a second facing surface, a first side surface, a second side surface, an upper end surface and a lower end surface; and a connector for holding the plates in a plate assembly having a first end and a second end, and wherein the plates in the plate assembly are positioned against each other and held by the connector adjacent each other such that each plate has at least one facing surface disposed against a facing surface of an adjacent plate and wherein the lower end surfaces of the plates are all oriented in the same plane and cooperate to form a bonding surface, the bonding surface having a semiconductor epitaxial layer bonded thereto.

14. The cleaving assembly of claim 13 further comprising a metallic bonding layer disposed upon the bonding surface for bonding the epitaxial layer to the cleaving assembly.

15. The cleaving assembly of claim 13 wherein the semiconductor epitaxial layer is disposed upon a substrate.

16. The cleaving assembly of claim 13 wherein the plates are metallic.

17. The cleaving assembly of claim 13 wherein the plates are diamond.

* * * * *